(12) United States Patent
Chen et al.

(10) Patent No.: US 7,436,671 B2
(45) Date of Patent: Oct. 14, 2008

(54) RETENTION MODULE FOR A HEAT SINK

(75) Inventors: Chin-Lung Chen, Taipei Hsien (TW); Cui-Jun Lu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/682,786

(22) Filed: Mar. 6, 2007

(65) Prior Publication Data

US 2008/0218976 A1    Sep. 11, 2008

(51) Int. Cl.
*H05K 7/20* (2006.01)
*F28F 7/00* (2006.01)

(52) U.S. Cl. .................. 361/710; 361/704; 361/709; 361/719; 165/80.3; 165/185; 174/16.3

(58) Field of Classification Search ............... 361/697, 361/704, 709–710, 719; 165/104.33, 185; 174/16.3
See application file for complete search history.

(56) References Cited

U.S. PATENT DOCUMENTS

| | | | |
|---|---|---|---|
| 6,161,611 A * | 12/2000 | Cheng | 165/80.3 |
| 6,343,017 B1 * | 1/2002 | Yu et al. | 361/704 |
| 6,707,674 B1 * | 3/2004 | Bryant et al. | 361/704 |
| 6,970,354 B2 * | 11/2005 | Villanueva et al. | 361/687 |
| 2006/0176669 A1 | 8/2006 | Chen et al. | |
| 2007/0277957 A1 * | 12/2007 | Wu et al. | 165/80.3 |

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A retention module (10) for securing a heat sink (20) to a printed circuit board (30) includes a pair of carriage arms (12) separated by a space and a connecting wall (14) interconnecting opposite rear free ends of the carriage arms. Each of the carriage arms integrally forms a lock catch (122) thereon to clasp the heat sink. A pair of opposite positioning ears (15) extend upwardly from corners where the carriage arms are connected with the connecting wall. The retention module and the heat sink are preassembled together via the lock catches clasping the heat sink before the retention module is mounted on the printed circuit board.

16 Claims, 6 Drawing Sheets

RETENTION MODULE FOR A HEAT SINK

BACKGROUND OF THE INVENTION

1. Field of the Invention

The present invention relates to a retention module, and particularly to a retention module which can be preassembled to a heat sink before the retention module is mounted on a printed circuit board.

2. Description of Related Art

Nowadays, numerous heat dissipation assemblies are used to dissipate heat generated by electronic devices. Typically, a heat dissipation assembly is mounted on a printed circuit board having an electronic device mounted thereon. The heat dissipation assembly comprises a heat sink mounted on the electronic device, a retention module around the electronic device and a strip-shaped clip. In assembly, the retention module is mounted on the printed circuit board via a plurality of screws. The clip sits in a groove defined in the heat sink resting on the electronic device. Two free ends of the clip are engaged with the retention module and fix the heat sink in the retention module. However, it is awkward and inefficient to assemble.

What is needed, therefore, is a retention module which can be preassembled to a heat sink before it is mounted on a printed circuit board.

SUMMARY OF THE INVENTION

A retention module in accordance with a preferred embodiment of the present invention is used for securing a heat sink to a printed circuit board. The retention module includes a pair of carriage arms separated by a distance and a connecting wall interconnecting opposite rear free ends of the carriage arms. Each of the carriage arms integrally forms a lock catch thereon to clasp the heat sink. A pair of opposite positioning ears extend upwardly from corners of the retention module where the carriage arms are connected with the connecting wall. The retention module and the heat sink are held together via the lock catches before the retention module together with the heat sink is mounted on the printed circuit board.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
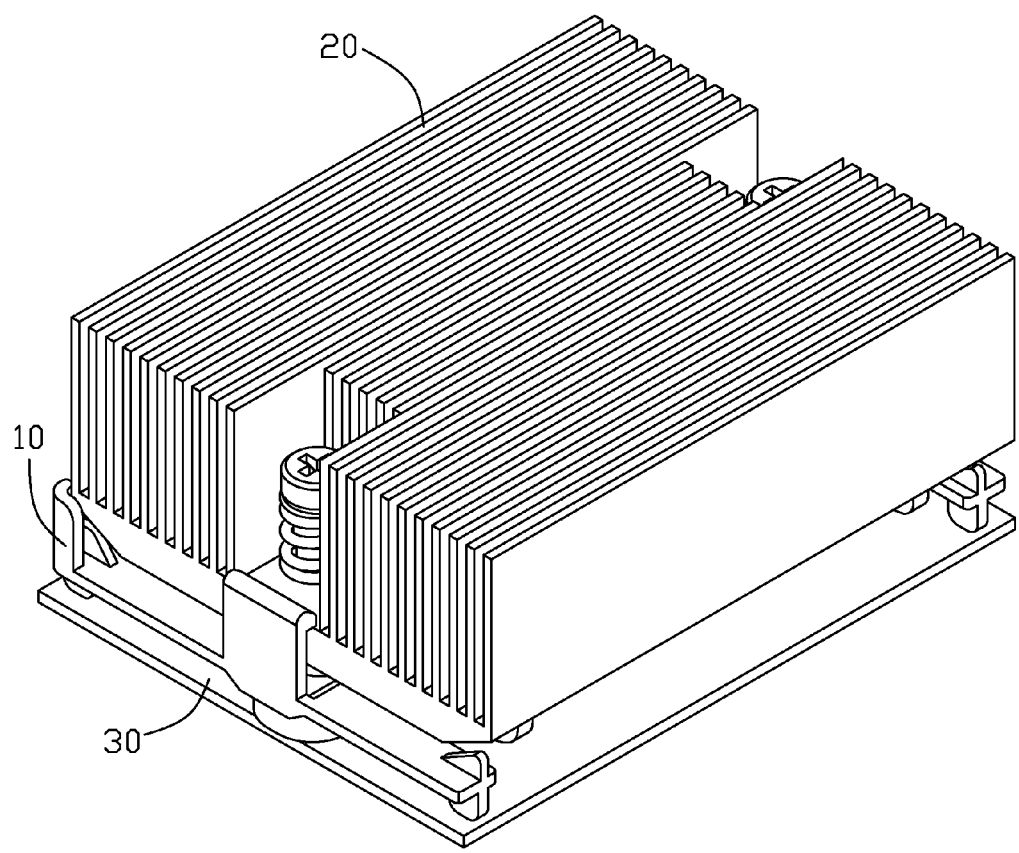
FIG. 1 is an assembled, isometric view of an assembly of a retention module and a heat sink in accordance with a preferred embodiment of the present invention, wherein the assembly of the retention module and the heat sink is installed on a printed circuit board.
Figure 2:
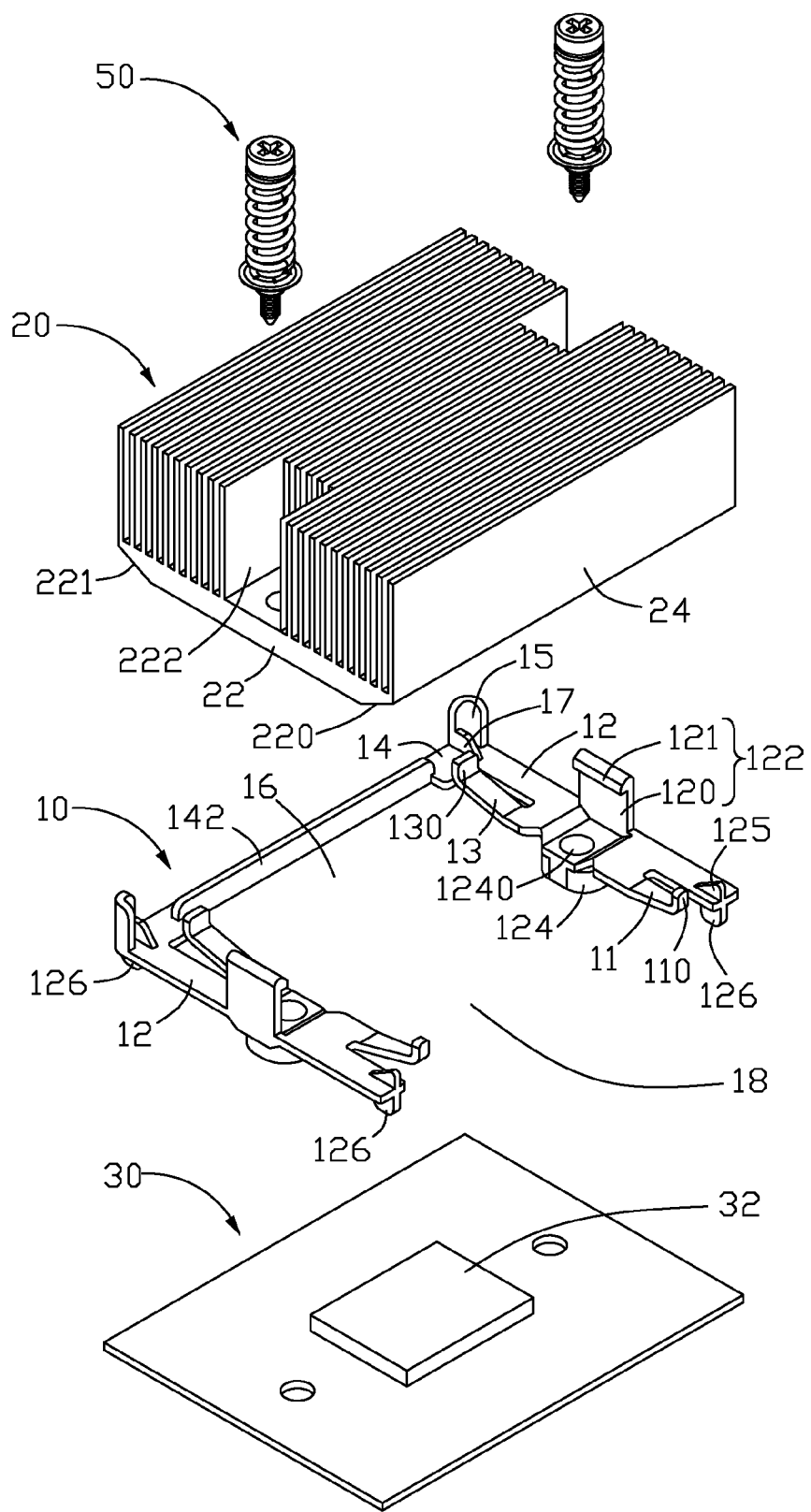
FIG. 2 is an exploded, isometric view of FIG. 1.

Referring to FIGS. 1-2, a retention module 10 of the present invention is used for securing a heat sink 20 to a printed circuit board (PCB) 30. The retention module 10 can be assembled to the heat sink 20 before it is mounted onto the PCB 30. A CPU 32 is mounted on the PCB 30. The heat sink 20 is attached on the CPU 32 to dissipate heat generated by the CPU 32.

Figure 3:
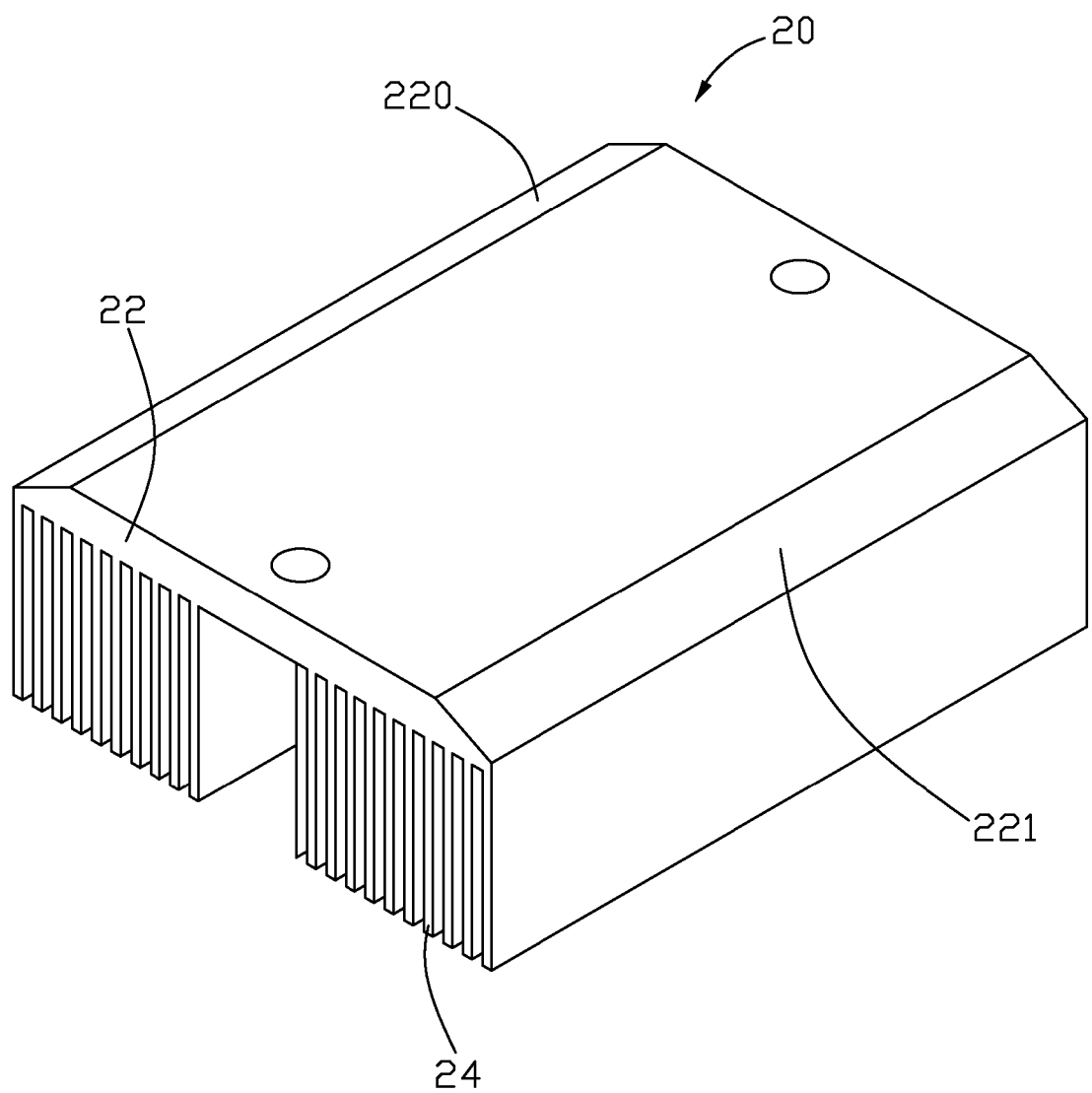
FIG. 3 is an enlarged view of the heat sink of FIG. 2 shown from a bottom aspect.

Referring also to FIG. 3, the heat sink 20 is integrally extruded from a heat conductive material, such as aluminium, and comprises a base 22 and a plurality of parallel fins 24 perpendicularly and upwardly extending from the base 22. Two opposite front and rear sides of a bottom of the base 22 of the heat sink 20 are slantwise cut away in a manner such that two beveled surfaces 220, 221 are formed thereon for facilitating an insertion of the heat sink 20 into the retention module 10. In this embodiment, the beveled surfaces 220, 221 are unsymmetrical. An included angle between the beveled surface 220 and a bottom surface of the base 22 is larger than that between the beveled surface 221 and the bottom surface of the base 22. Alternatively the beveled surfaces 220, 221 may be symmetrically formed, making the included angle between the beveled surface 220 and the bottom surface of the base equal to that between the beveled surface 221 and the bottom surface of the base 22. A plurality of continuous fins 24 located at central portions of the fins 24 are partly cut away at opposite lateral sides thereof in a manner such that a pair of opposite receiving spaces 222 are formed for providing insertions of fasteners 50 to mount the heat sink 20 on the PCB 30.

Figure 4:
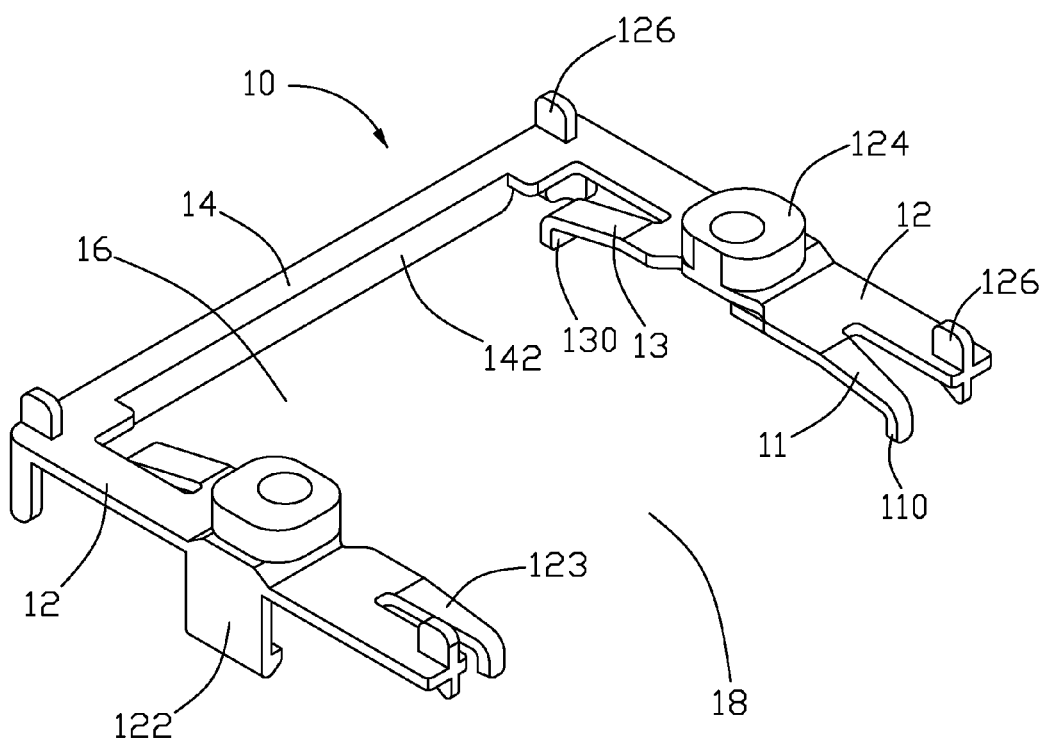
FIG. 4 is an enlarged view of the retention module of FIG. 2 shown from a bottom aspect.

Referring to FIGS. 2 and 4, the retention module 10 is made of rigid plastic material and includes a pair of flat carriage arms 12 separated by a distance and a connecting wall 14 interconnecting opposite rear free ends of the carriage arms 12 in a manner such that an opening 16 is defined by the carriage arms 12 and the connecting wall 14. The other two opposite front free ends of the carriage arms 12 are disconnected in a manner such that an entry 18 is formed for an insertion of the heat sink 20. In this fashion cost of the whole retention module 10 is lowered. A CPU 32 of the PCB 30 is received in the opening 16 and contacts with the bottom surface of the heat sink 20. The heat sink 20 can be pushed onto the retention module 10 along a front-to-rear direction.

Figure 5:
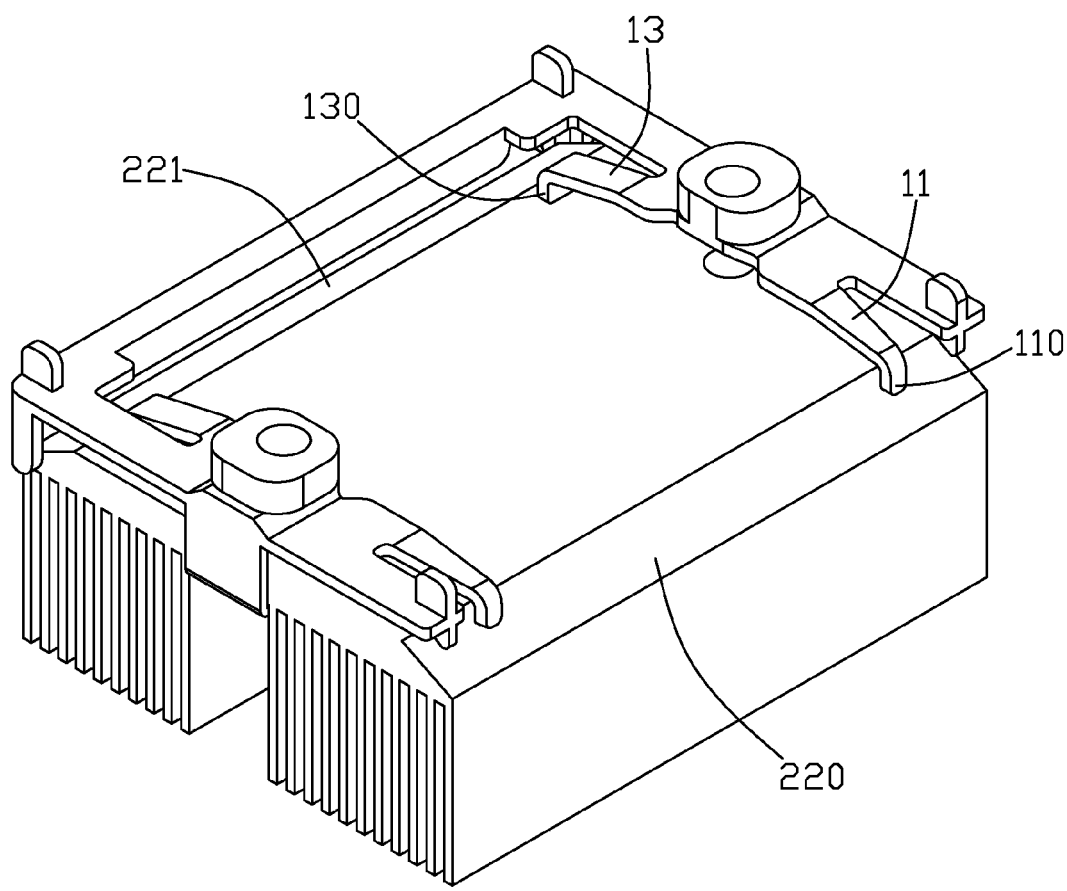
FIG. 5 is an assembled and reversed view of the retention module and the heat sink of FIG. 1.

A lock catch 122 is integrally formed on each carriage arm 12. The lock catch 122 comprises a flat extension plate 120 extending perpendicularly from a central portion of an outer side of the carriage arm 12 and a hook 121 formed on a top of the extension plate 120. The extension plates 120 are oriented perpendicular to the fins 24 of the heat sink 20. The hooks 121 are used for engaging with a top surface of the base 22 of the heat sink 20 at the receiving spaces 222. A cylindrical supporting post 124 extends downwardly from the central portion of each carriage arm 12 for contacting with the PCB 30 and separating the carriage arms 12 and the connecting wall 14 a distance from the PCB 30. The distance is substantially equal to a thickness of the CPU 32. A through hole 1240 is defined in a central portion of the supporting post 124 for providing a passage of the corresponding fastener 50. Two spring wings 11, 13 extend from opposite front and rear sides of each supporting post 124. The wings 11, 13 connect with the corresponding carriage arm 12. The wings 11, 13 extend slantwise and upwardly relative to the carriage arm 12. An engaging portion 110, 130 is bent upwardly from a free end of each wing 11, 13 for elastically supporting the heat sink 20 mounted thereon. In this embodiment, the two spring wings 11, 13 are unsymmetrical. A width of the wing 13 is uniform, while a width of the wing 11 is gradually reduced towards the free end of the wing 11. Alternatively, the two spring wings 11, 13 may be arranged symmetrically either side of the supporting post 124. Referring to FIG. 5, the engaging portion 130 is used to engage with the bottom surface of the heat sink 20 near to the beveled surface 221, and the engaging portion 110 is used to engage with the beveled surface 220.

Referring to FIGS. 2 and 4 again, a guiding portion 125 is formed at a front end of each carriage arm 12. The guiding portion 125 has an inclined surface oriented inwardly for guiding the insertion of the heat sink 20. A positioning ear 15 extends upwardly from each of corners where the carriage arms 12 are connected with the connecting wall 14. The positioning ear 15 has a concave surface oriented towards the opening 16. A stop portion 17 is connected with an inner side of each positioning ear 15 and parallel to the extension plate 120 of the lock catch 122. The stop portion 17 has an inclined surface facing the inclined surface of the guiding portion 125. A pair of opposite reinforced portions 126 extend downwardly from two opposite ends of a bottom surface of each carriage arm 12. The reinforced portions 126 and the supporting post 124 cooperatively support the retention module 10 on the PCB 30 to separate the carriage arms 12 and the connecting wall 14 from the PCB 30. A baffle plate 142 is bent perpendicularly and upwardly from an inner side of the connecting wall 14 for strengthening the connecting wall 14; simultaneously, when the retention module 10 is vibrated, the baffle plate 142, the positioning ears 15 and the stop portions 17 cooperatively prevent the heat sink 10 from moving in a front-to-rear direction.

Figure 6:
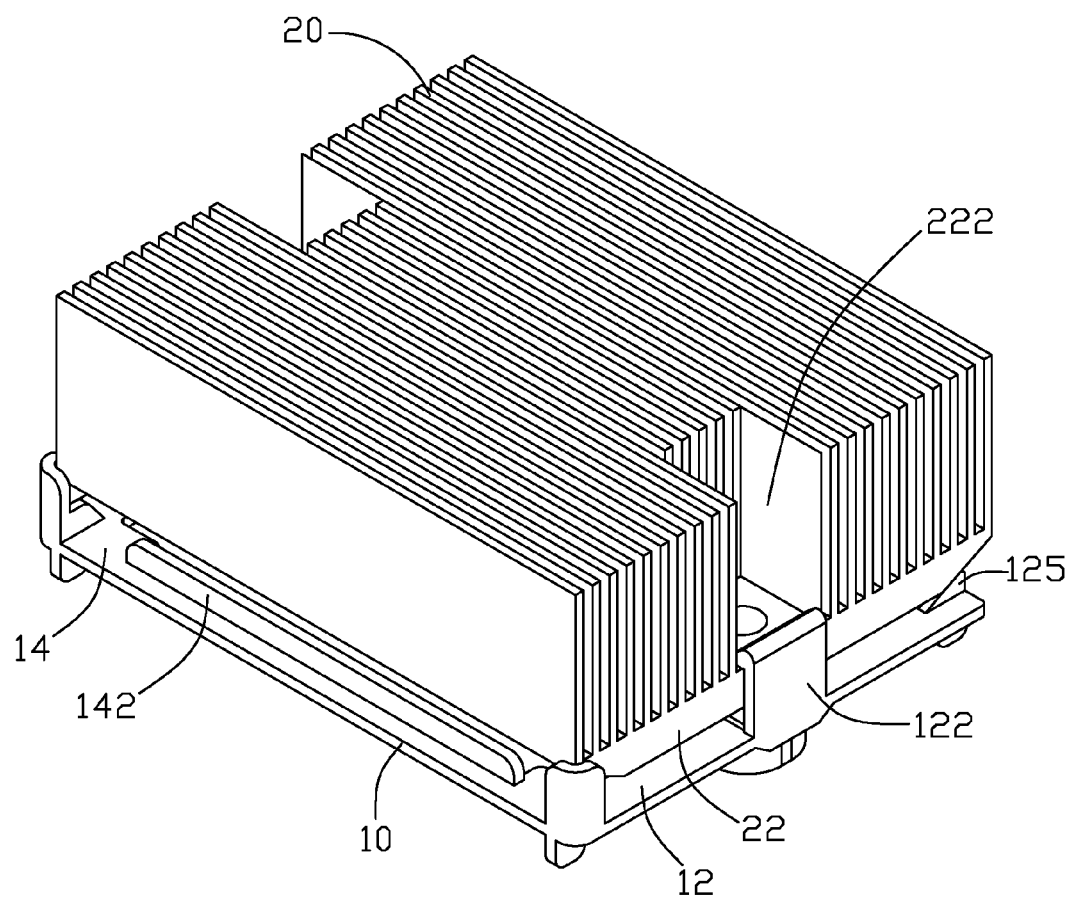
FIG. 6 is an assembled view of the retention module and the heat sink of FIG. 1, but shown from another aspect.

Referring to FIGS. 1-2 and 6, in assembly of the present invention, the heat sink 20 is pushed onto the retention module 10 from the entry 18 in a manner such that the lock catches 122 snappingly engage with the base 22 of the heat sink 20 at the receiving spaces 222; simultaneously, spring wings 11, 13 is pressed downwardly by the heat sink 20 to provide an elastic force to the heat sink 20. Thus, the heat sink 20 and the retention module 10 are attached together. An assembly of the heat sink 20 and the retention module 10 is attached on the CPU 32 of the printed circuit board 30. The fasteners 50 extend through the base 22 of the heat sink 20 at the receiving spaces 222 and the supporting posts 124 of the retention module 10 to mount the assembly of the heat sink 20 and the retention module 10 onto the printed circuit board 30.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A retention module for securing a heat sink to a printed circuit board, the retention module comprising:
    a pair of carriage arms separated by a distance, each of the carriage arms integrally forming a lock catch thereon to clasp the heat sink; and
    a connecting wall interconnecting opposite rear ends of the carriage arms, a pair of opposite positioning ears extending upwardly from corners where the carriage arms are connected with the connecting wall;
    wherein the retention module and the heat sink are assembled together via the lock catches before the retention module is mounted on the printed circuit board; and
    wherein each of the lock catches comprises a flat extension plate extending perpendicularly from a central portion of an outer side of the carriage arm and a hook formed on a top of the extension plate.

2. The retention module as claimed in claim 1, wherein a cylindrical supporting post extends downwardly from the central portion of each of the carriage arms to contact with the printed circuit board and hold the carriage arms and the connecting wall a distance from the printed circuit board.

3. The retention module as claimed in claim 1, wherein other two opposite front free ends of the carriage arms are disconnected in a manner such that the heat sink is capable of being pushed onto the retention module along a front-to-rear direction.

4. The retention module as claimed in claim 1, wherein two spring wings extend from opposite front and rear sides of a central portion of each of the carriage arms.

5. The retention module as claimed in claim 4, wherein the two spring wings extend slantwise and upwardly relative to a corresponding carriage arm.

6. The retention module as claimed in claim 5, wherein one of the two spring wings has a uniform width, while the other spring wing has a gradually varied width.

7. The retention module as claimed in claim 5, wherein an engaging portion is bent upwardly from a free end of each of the spring wings for elastically contacting with a bottom of the heat sink.

8. The retention module as claimed in claim 1, wherein a baffle plate is bent perpendicularly from an inner side of the connecting wall for strengthening the connecting wall.

9. The retention module as claimed in claim 1, wherein a stop portion is connected with an inner side of each of the positioning ears, the stop portion has an inclined surface.

10. The retention module as claimed in claim 9, wherein a guiding portion is formed at a front end of each of the carriage arms, and the guiding portion has an inclined surface facing the inclined surface of the stop portion for facilitating an insertion of the heat sink.

11. A heat sink assembly comprising:
    a retention module mounted on a printed circuit board having an electronic component thereon, the retention module comprising a pair of parallel and spaced carriage arms and a connecting wall interconnecting opposite rear ends of the carriage arms, a lock catch extending upwardly from each of the carriage arms; and
    a heat sink having a base contacting with the electronic component and a plurality of parallel fins extending from the base;
    wherein other two opposite front free ends of the carriage arms are disconnected, and the heat sink is fastened with the retention module via the lock catches clasping with the base of the heat sink, and two fasteners extending through the base of the heat sink at positions near the two lock catches, the carriage arms of the retention module and the printed circuit board to connect the heat sink together with the retention module and the printed circuit board with the electronic component together.

12. The heat sink assembly as claimed in claim 11, wherein two opposite front and rear sides of a bottom of the base are slantwise cut away in a manner such that two beveled surfaces are formed for facilitating an insertion of the heat sink onto the retention module.

13. The heat sink assembly as claimed in claim 11, wherein two spring wings extend slantwise and upwardly from opposite sides of a central portion of each of the carriage arms for elastically contacting with the base of the heat sink.

14. The heat sink assembly as claimed in claim 13, wherein a baffle plate is bent perpendicularly from an inner side of the connecting wall for strengthening the connecting wall.

15. The heat sink assembly as claimed in claim 11, wherein a guiding portion is formed at a front end of each of the carriage arms, and the guiding portion has an inclined surface.

16. The heat sink assembly as claimed in claim 11, wherein portions of the fins at a middle of two opposite sides of the heat sink are removed away to form two receiving spaces, the hooks clasping the base in the receiving spaces and the fasteners extending through the receiving spaces.

* * * * *